(12) United States Patent
Cohen et al.

(10) Patent No.: US 6,300,218 B1
(45) Date of Patent: Oct. 9, 2001

(54) METHOD FOR PATTERNING A BURIED OXIDE THICKNESS FOR A SEPARATION BY IMPLANTED OXYGEN (SIMOX) PROCESS

(75) Inventors: Guy Moshe Cohen, Mohegan Lake; Devendra Kumar Sadana, Pleasantville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/567,095

(22) Filed: May 8, 2000

(51) Int. Cl.[7] .................................................. H01L 21/76
(52) U.S. Cl. ............................................. 438/423; 438/407
(58) Field of Search ...................................... 438/407, 423

(56) References Cited

U.S. PATENT DOCUMENTS 6,074,929 * 6/2000 Thomas ................................. 438/407
6,110,794 * 8/2000 Liu ....................................... 438/407
6,197,656 * 3/2001 Adkisson et al. ..................... 438/423

OTHER PUBLICATIONS

Bussmann et al SOI Device Islands Formed by Oxygen Implantation Through Patterned Masking Layers SOS/SOI Teacnology Conference 1990, IEEE 1990 pp. 51–52.*

* cited by examiner

Primary Examiner—Charles Bowers
Assistant Examiner—David S Blum
(74) Attorney, Agent, or Firm—Marian Underweiser, Esq.; McGinn & Gibb, PLLC

(57) ABSTRACT

A method of forming a patterned buried oxide film, includes performing an implantation into a substrate, forming a mask on at least portions of the substrate for controlling the implantation diffusion, and annealing the substrate to form a buried oxide. The mask may be selectively patterned. A region that is covered by the mask has a thinner buried oxide than an area which is exposed directly to the annealing ambient.

36 Claims, 8 Drawing Sheets

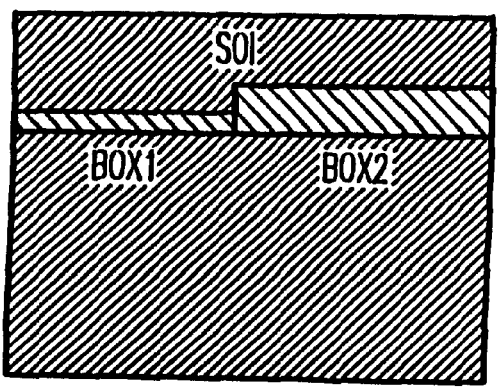 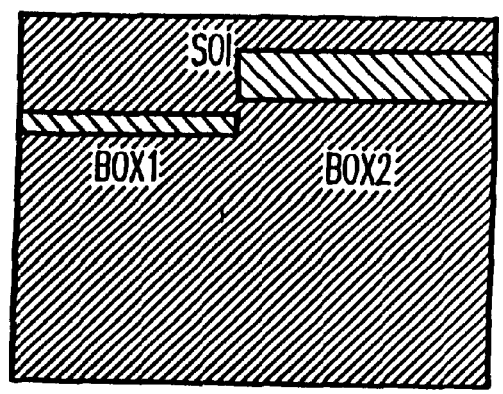
FIG.11A
PRIOR ART
FIG.11B
PRIOR ART

METHOD FOR PATTERNING A BURIED OXIDE THICKNESS FOR A SEPARATION BY IMPLANTED OXYGEN (SIMOX) PROCESS

BACKGROUND OF THE INVENTION

1. Field of the Invention

The present invention relates to a novel technique for the fabrication of a semiconductor device, and more particularly to a method for producing a patterned buried oxide (BOX) film for a semiconductor device.

2. Description of the Related Art

Complementary Metal Oxide Semiconductor (CMOS) circuits, which are fabricated using Silicon On Insulator (SOI) wafers have important advantages over conventional bulk CMOS, such as the absence of latch-up, a reduced parasitic drain-source capacitance, ease of making shallow junctions, and higher immunity to soft-errors (e.g., see J. P. Colinge, Silicon-On-Insulator Technology: materials to VLSI, $2^{nd}$ Ed., Kluwer Academic Publishers, 1997).

The use of SOI wafers is not limited to CMOS. Micromachining applications also use SOI wafers for the fabrication of sensors and thermally isolated detectors. Separation by Implanted Oxygen (SIMOX) is currently the main technique used for the fabrication of Silicon-On-Insulator (SOI) wafers. A SIMOX wafer has a superficial silicon layer on top of a buried oxide (BOX) film.

The buried $SiO_2$ film (BOX) is formed by implanting oxygen ions beneath the surface of a silicon wafer, and subsequently annealing the wafer at a high temperature (e.g., typical anneal temperatures are from about 1300° C. to about 1400° C.). Uniform and continuous BOX with atomically flat Si and $SiO_2$ interfaces are formed. During the oxygen implant the wafer is heated typically to about 600° C. to about 650° C. This allows the implant damage to "self anneal" during the implant. Depending on the implant dose the temperature window may be extended from 200 C to about 800 C. For the standard dose (such as $10^{18}$ $cm^{-2}$), if the implant is carried out at a temperature which is lower than about 500° C., the top Si layer would amorphize due to the implantation damage, and the Si over layer would remain polycrystalline upon further annealing. Wafer heating is achieved without additional heating if a high-current implanter is used. For low beam current implanters, a combination of external heating and beam current heating is used to achieve the required wafer heating.

Conventional efforts to fabricate a patterned BOX, with varying BOX thicknesses mainly focus on implanting the oxygen through a mask. The BOX layer forms only where the oxygen atoms are either not blocked or partially blocked by the implant mask. However, this technique is disadvantageous for several reasons. For example, there is a high density of defects (e.g., primarily dislocations) formed beneath the mask edge region.

Additionally, from a wafer manufacturing point of view it is more desirable to ship "ready to anneal SIMOX wafers", on which the customer may layout his specific mask, rather than implanting wafers that were shipped from customers with the customer mask for a SIMOX implant.

Moreover, a digitally patterned BOX can be produced with only one implant, since the regions protected by the implant mask will not form any BOX. To obtain an SOI wafer with two BOX thicknesses, a second implant using the complementary mask is required. Thus, the number of steps of such a process is increased, thereby making it cumbersome and complex.

Further, the conventional techniques require two masked implants to obtain a patterned BOX. The alignment of the depth position of the first oxygen implant to the depth position of the second implant is not readily achieved, especially if the buried oxide films are thin. The problem is illustrated in FIGS. 11A and 11B in which FIG. 11A shows a desired BOX and FIG. 11B shows a misaligned BOX. Thus, in the conventional technique, a first BOX is not necessarily aligned with a second BOX.

SUMMARY OF THE INVENTION

In view of the foregoing and other problems, disadvantages, and drawbacks of the conventional methods and structures, an object of the present invention is to provide a method for forming a patterned buried oxide (BOX) film.

Another object is to tune a thickness of the BOX during high temperature annealing.

Yet another object is to eliminate the need for a selective BOX implant.

Still another object is to provide a patterned BOX such that a SOI film has no impact on the density of defects at an edge region.

In a first aspect of the present invention, a method of forming a patterned buried oxide film, includes performing an implantation into a substrate, forming a mask on at least portions of the substrate for controlling the implantation diffusion, patterning the mask, and annealing the substrate to form a buried oxide, wherein a region that is covered by the mask has a thinner buried oxide than an area which is exposed directly to the annealing ambient.

In a second aspect, a method of forming a patterned buried oxide film, includes performing an implantation into a substrate, forming a mask on at least portions of the substrate for controlling the implantation diffusion, and annealing the substrate to form a buried oxide, wherein a region that is covered by the mask has a thinner buried oxide than an area which is exposed directly to the annealing ambient.

With the unique and unobvious aspects of the structure and method of the present invention, the patterned BOX thickness can be tuned during high temperature annealing.

Further, the method of the present invention also eliminates any need for a selective BOX implant which is customer/product specific and thus separates the customer specific needs from the wafer fabrication process. Additionally, since the patterned BOX is generated from a continuous oxygen implant, the SOI film has no impact on density of defects at the edge region. Further, there is no need to align a first BOX to a second BOX in the present invention since both the first (e.g., thin) and the second (e.g., thick) BOX are generated by the same implant.

Still further, if the oxygen implant dose is reduced to a critical level, the BOX under the masked region may be pinched completely. This allows the fabrication of a "digital BOX", without using a blocking mask during the oxygen implant. (FIG. 10 shows a cross section in which a continuous BOX is obtained in the open region and a broken (almost pinched) BOX is obtained under the masked region.).

The inventive process has been verified experimentally, with cross-sectional images showing examples of patterned SIMOX wafers.

BRIEF DESCRIPTION OF THE DRAWINGS

The foregoing and other purposes, aspects and advantages will be better understood from the following detailed description of a preferred embodiment of the invention with reference to the drawings, in which:

FIG. 1 is a cross-sectional view of a structure processed with an oxygen implantation according to a method of the present invention;

FIG. 2 is a cross-sectional view of the structure processed in FIG. 1 and including a mask deposited on an oxide pad according to the method of the present invention;

FIG. 3 is a cross-sectional view of the structure of FIG. 2, with the mask having been patterned;

FIG. 4 is a cross-sectional view of the structure of FIG. 3 after annealing according to the method of the present invention;

FIGS. 11A and 11B illustrate a problem of the conventional technique, with FIG. 11A illustrating a desired BOX and FIG. 11B illustrating a misaligned BOX.

DETAILED DESCRIPTION OF PREFERRED EMBODIMENTS OF THE INVENTION

Figure 1:
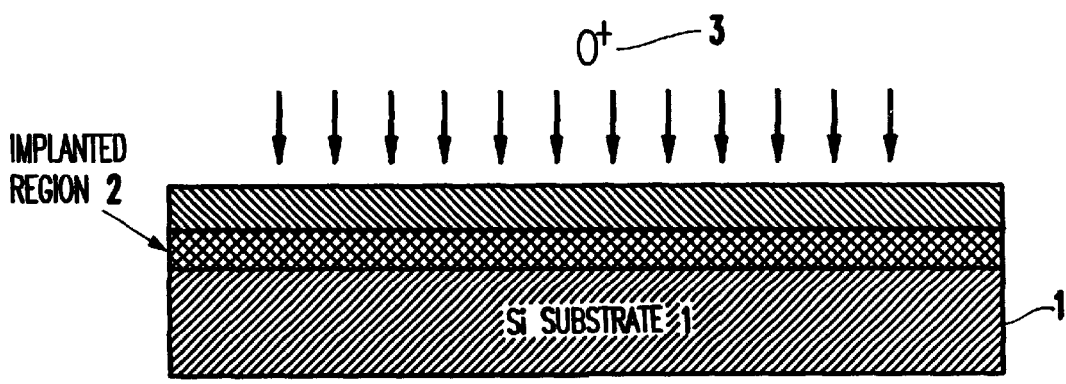
FIGS. 1–4 illustrate processing steps according to a method of the present invention and specifically.

Referring now to the drawings, and more particularly to FIGS. 1–10, there are shown preferred embodiments of the method and structures according to the present invention.

First Embodiment

Referring to FIGS. 1–8 and 10, a first embodiment of method for fabricating a patterned buried oxide film according to the present invention will be described below.

Referring to FIG. 1, first an implant 3 (e.g., oxygen, nitrogen to form a buried nitrogen film, or a combination thereof; for illustration purposes, oxygen will be employed as described below) is implanted into a substrate 1 (e.g., formed of silicon, silicon-germanium (SiGe) silicon carbide (SiC), etc.; for illustration purposes, a silicon substrate will be employed as described below) using an energy of about 30 KeV to about 400 KeV, and more preferably 210 KeV, and a wafer temperature of between approximately 600° C. to 650° C. A typical implanted oxygen dose used is in the range of $10^{18}$ cm$^{-2}$, or $2 \times 10^{17}$ to $4 \times 10^{17}$ cm$^{-2}$. Other implant energies and oxygen doses may be used depending on the desired SOI and BOX thickness. The implanted region is shown at reference numeral 2 in FIG. 1.

Figure 2:
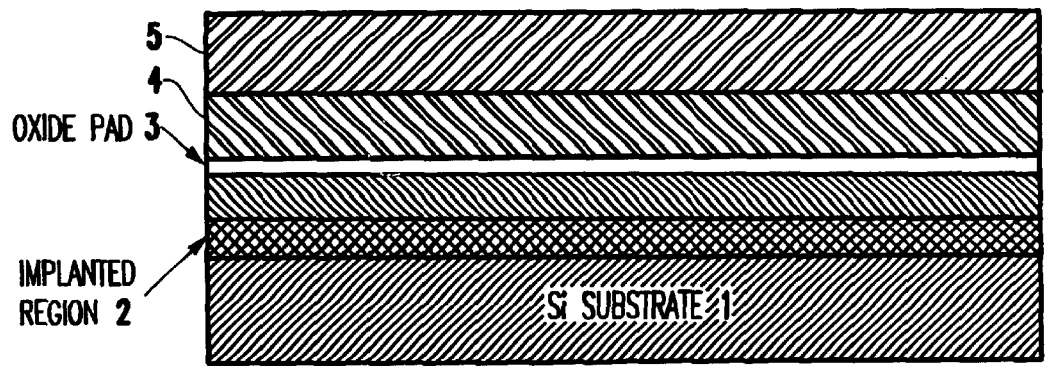

Thereafter, as shown in FIG. 2, a mask for controlling the oxygen diffusion during high temperature annealing is deposited and patterned. The mask will be referred to as an anneal mask. An exemplary structure of such a mask is a tri-layer structure of 500 nm Low Temperature Oxide (LTO) 5 formed on 100 nm nitride 4 which is formed on an oxide (e.g., 50 nm thick) 3. Other configurations and thicknesses are also operable as well.

Figure 3:
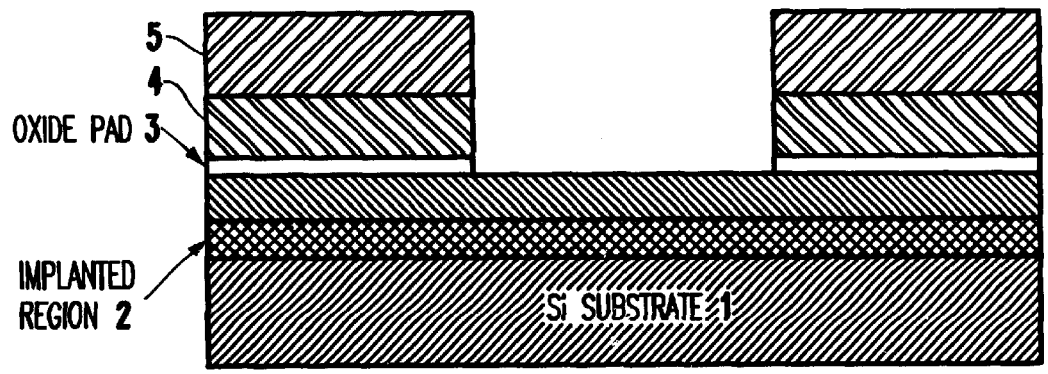

The mask is patterned using a conventional photo-resist lithography and reactive ion etching (RIE). The mask patterning is shown in FIG. 3.

Figure 4:
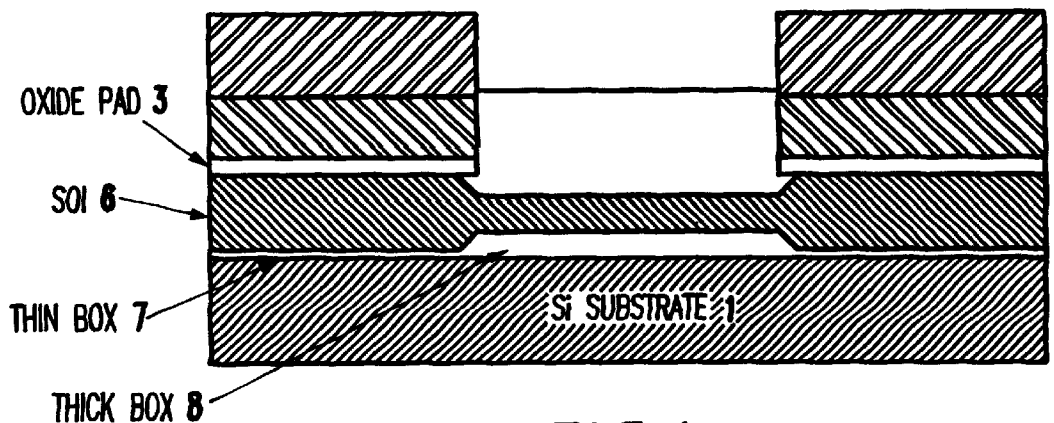

To form the buried oxide (BOX), the wafer is annealed at an annealing temperature of about 1300° C. to about 1400° C. The annealing is carried out in an ambient of Argon with >about 8% oxygen, but typically 20%. The anneal generates an SOI layer 6. Regions that are covered by the mask will have a thinner BOX 7 than areas which are exposed directly to the annealing ambient. A thick BOX 8 is formed in the open regions. For example, an exemplary thickness of the thinner BOX 7 is preferably within a range of about 10 nm to about 100 nm, and more preferably is about 40 nm. In contrast, an exemplary thickness of the thick BOX 8 is preferably within a range of about 100 nm to about 400 nm, and more preferably is about 100 nm. It is noted that a ratio of the relatively thick box to the relatively thin box depends on the application. The same applies to the preferred BOX thicknesses stated above. The patterned BOX formed by the anneal is shown in FIG. 4.

Figure 5:
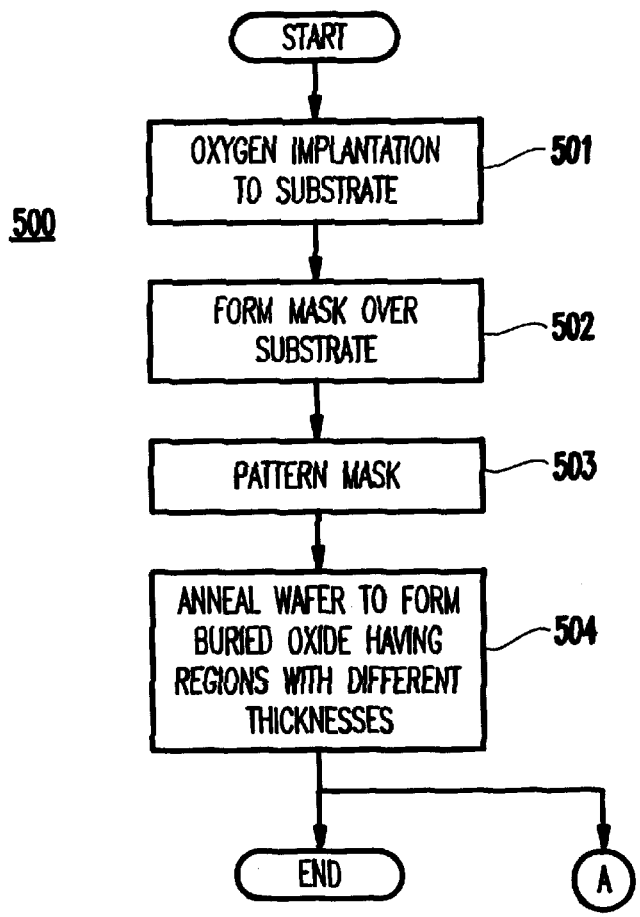
FIG. 5 is a flow diagram of the inventive method according to the first embodiment of the present invention.
Figure 6:
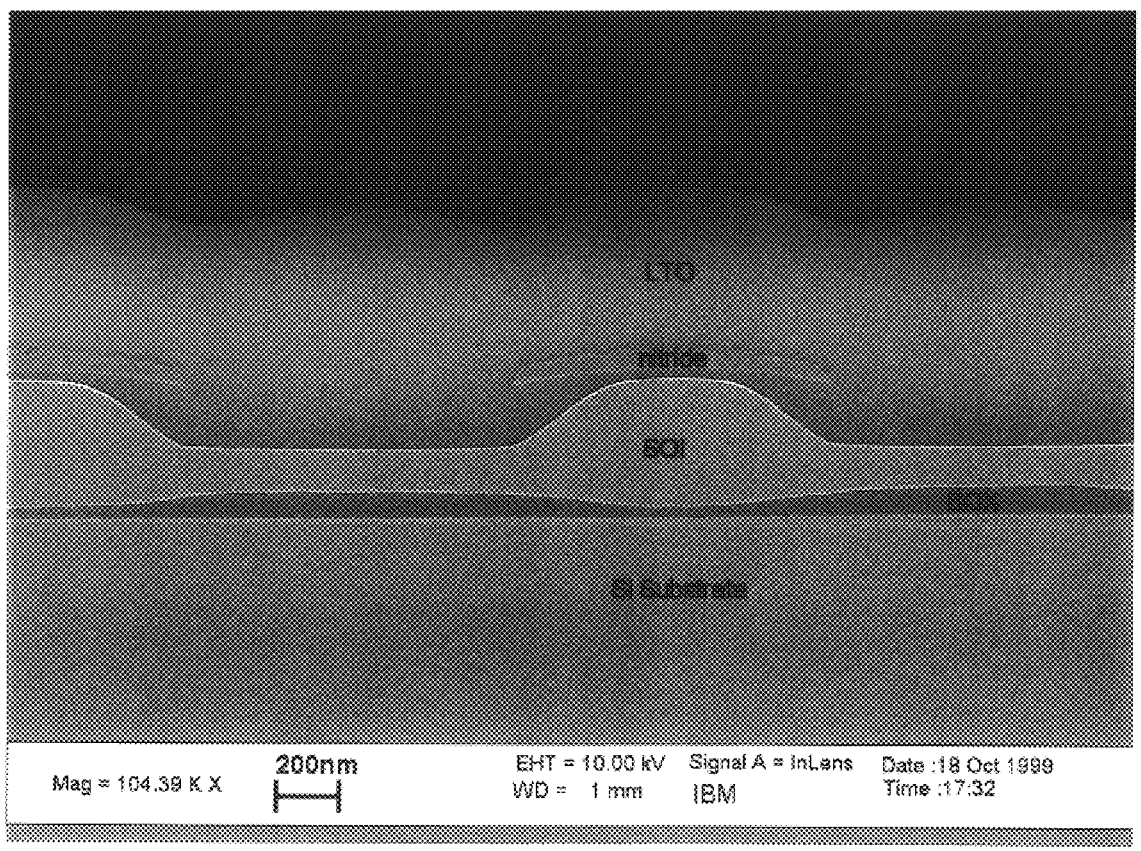
FIGS. 6–8 illustrate scanning electron micrographs (SEMs) of the inventive structure formed by the method, in which the masked regions show a thin BOX, while the open region (with no nitride mask) exhibits a thicker BOX.
Figure 7:
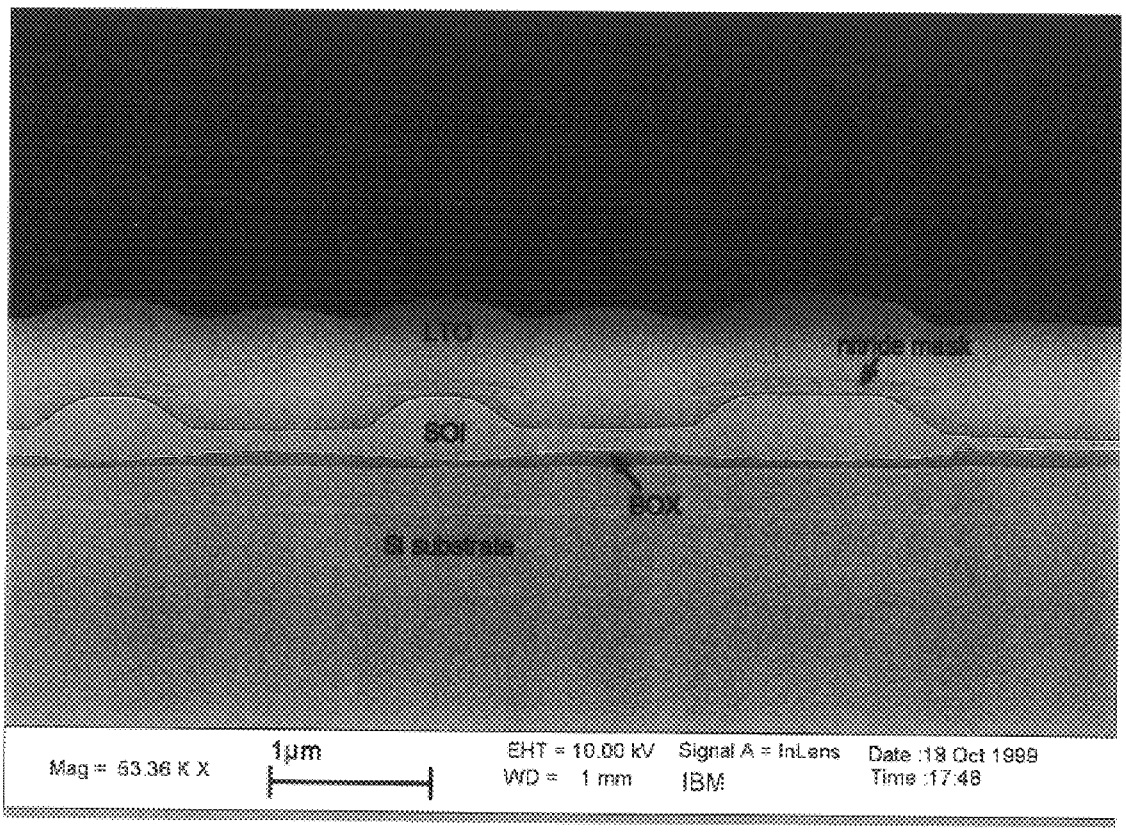
Figure 8:
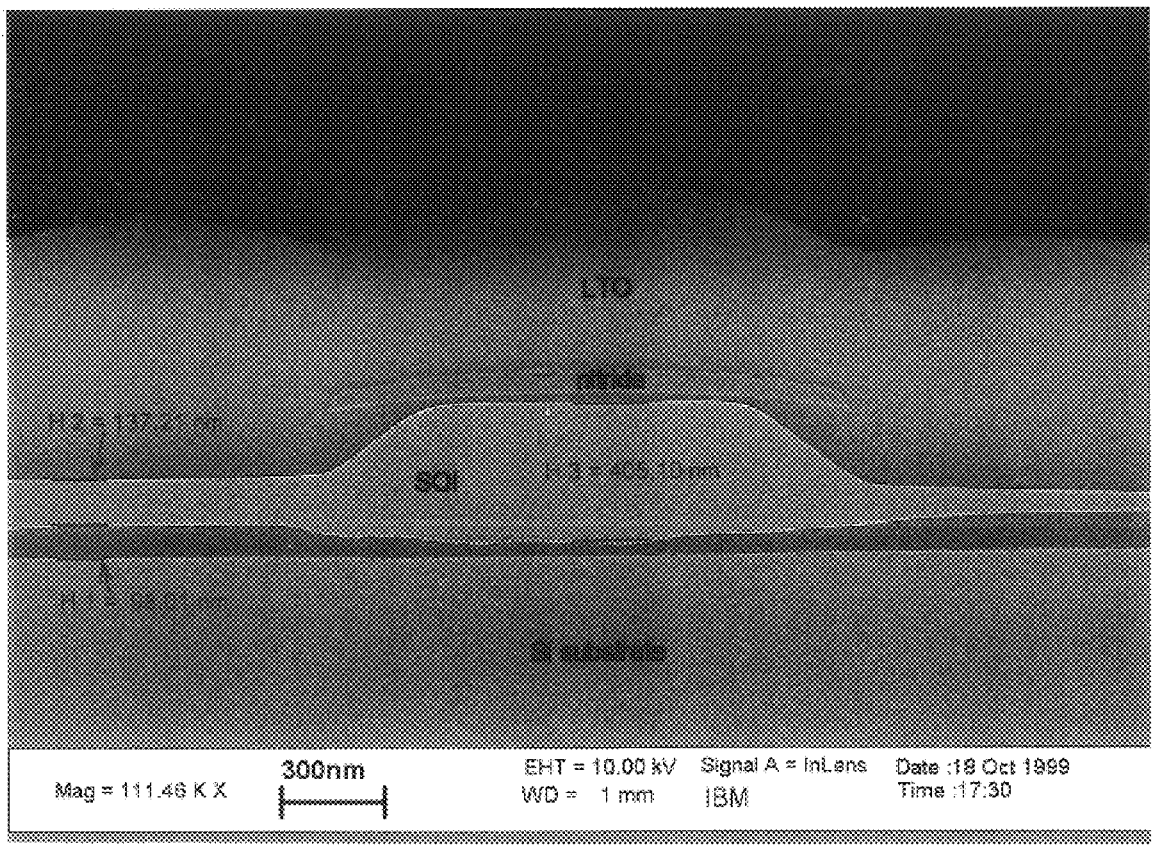

FIG. 5 illustrates a flow chart of the inventive method 500 according to the first embodiment, which shows the processing steps of FIGS. 1–4.

Specifically, in step 501 of FIG. 5 oxygen implantation occurs into at least a portion of a substrate (e.g., at least a portion of a blank silicon wafer).

In step 502, a mask is formed over the substrate to control the oxygen diffusion during annealing.

In step 503, the mask is patterned, and in step 504, high-temperature (e.g., at a temperature between about 1300° C. to about 1400° C.) annealing is performed, to generate a Silicon-on-insulator layer. The region(s) covered by the mask will have a thinner buried oxide than areas directly exposed to the annealing ambient.

It is noted that the lateral oxygen diffusion may limit the minimnum patterned BOX area that may be obtained. That is, in the masked regions, oxygen from the annealing ambient is blocked from diffusing into the silicon. However, at the mask edge there is a transition region due to lateral diffusion of oxygen from the ambient into the masked silicon. The transition region size is determined by the diffusion characteristic length. This characteristic length depends mainly on the anneal temperature and the oxygen concentration. If a masked region is smaller than the diffusion length, the masking would not be effective in blocking the oxygen supply to the BOX, and a thicker BOX would be obtained under the mask.

Figure 10:
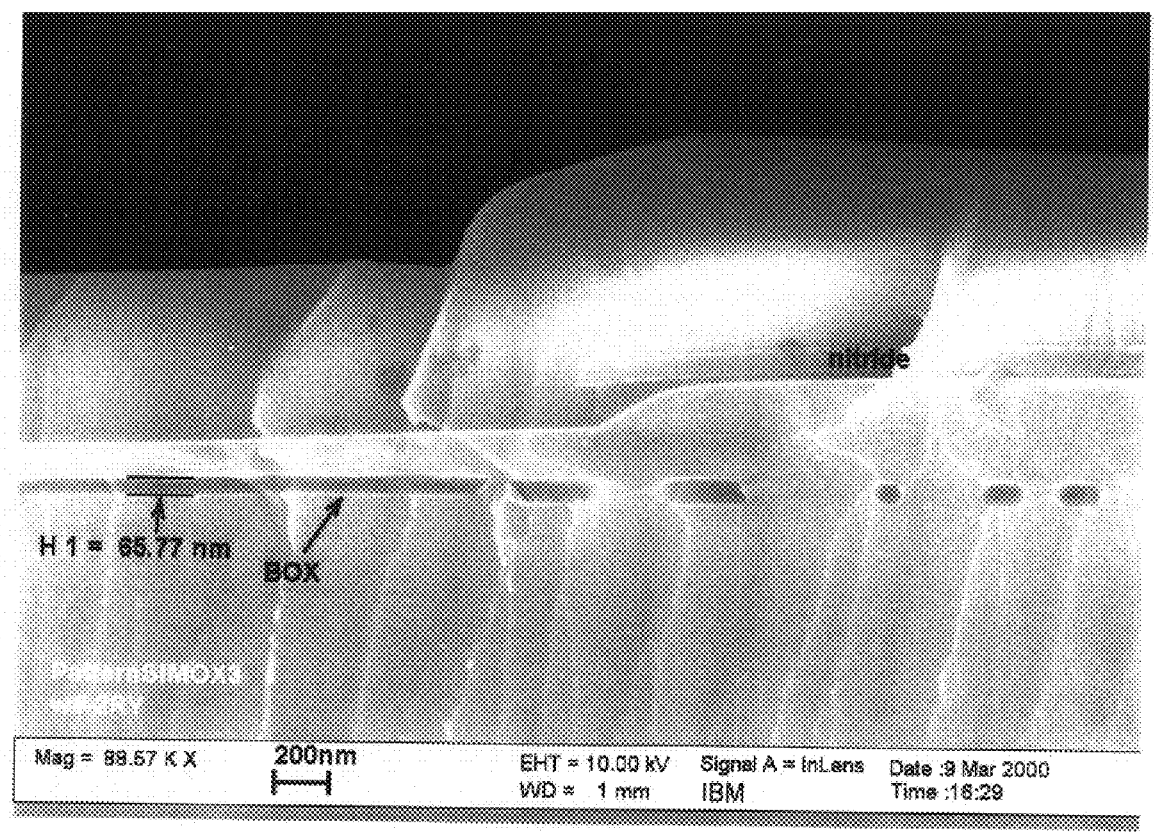
FIG. 10 illustrates scanning electron micrographs (SEMs) of the inventive structure formed by the method using a low dose oxygen implant, in which the BOX under the mask region starts to pinch off and is broken, while the BOX under the open region is uniform and continuous (note: an even lower oxygen dose is expected not to form any BOX under the masked region)

FIG. 10 illustrates scanning electron micrographs (SEMs) of the inventive structure formed by the method using a low dose oxygen implant (e.g., substantially less than $10^{18}$ cm$^{-2}$), in which the BOX under the mask region starts to pinch off and is broken, while the BOX under the open region is uniform and continuous. An even lower oxygen dosage rate is expected not to form any BOX under the masked region.

Thus, with the method of the first embodiment of the present invention, the pattern BOX thickness can be tuned during high temperature annealing. Also, there is no need for a selective BOX implant which is customer-/product-specific, and thus the customer specific needs are separated from the wafer fabrication process. Further, since the patterned BOX is generated from a continuous oxygen implant, the SOI film has no impact on density of defects at the edge region.

Indeed, the advantages of the present invention over the conventional methods (e.g., generating a patterned BOX based on a selective implant of oxygen using a blocking mask) are clearly shown below in Table 1:

TABLE 1

| Implant through a blocking mask | The Present Invention |
| --- | --- |
| Dislocations at the mask edges | Continuous tailoring of the patterned BOX thickness without dislocations at the mask edge |
| Two implants and two implant masks are required to obtain a thick and a thin BOX. | No mask is required during implant. Only one mask is required to obtain an SOI wafer with two BOX thicknesses. |
| Wafer manufacturing - Each lot is product-/customer-dependent. | All starting wafers are the same: Customer-specific pattern |

Second Embodiment

Figure 9:
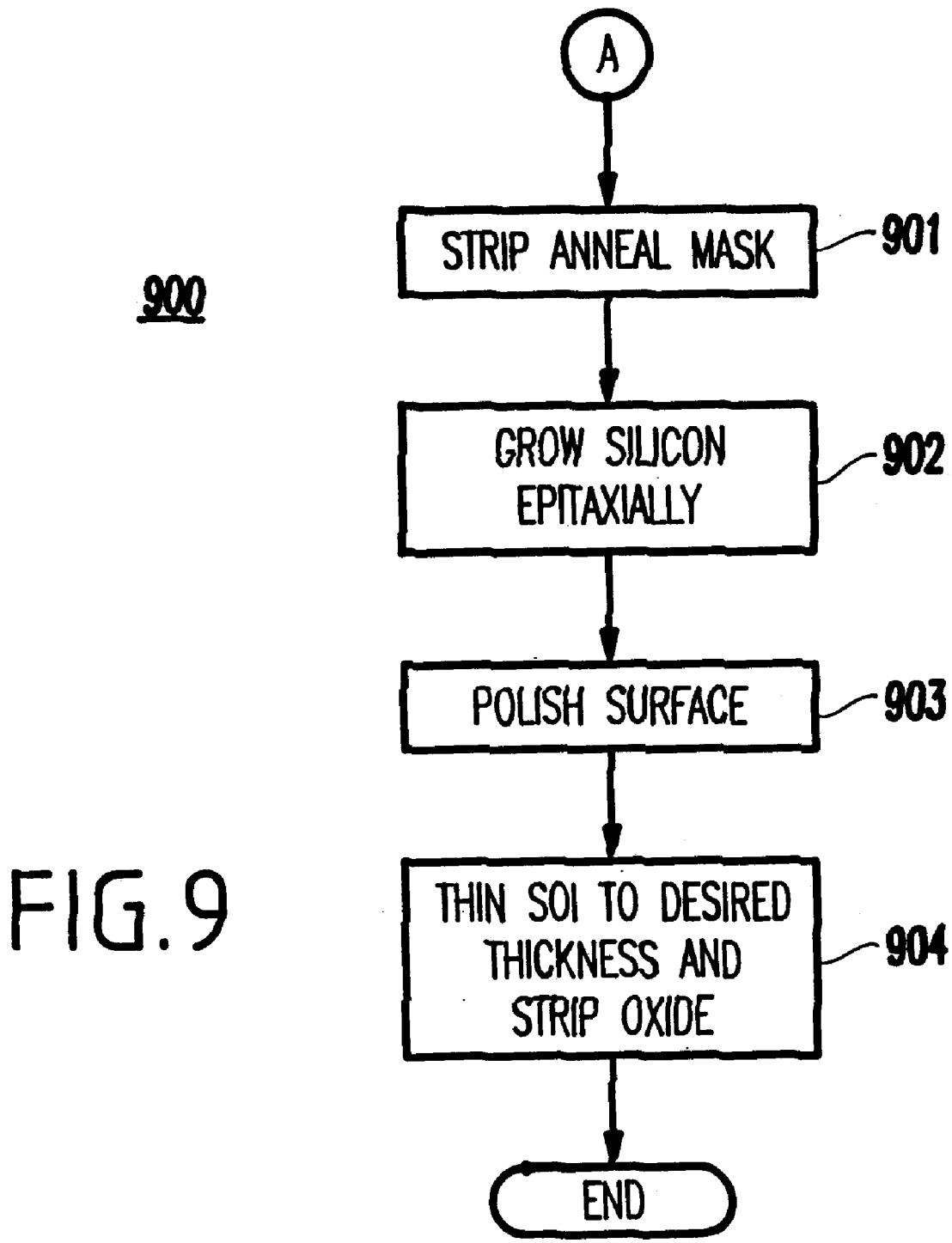
FIG. 9 is a flow diagram of the inventive method according to a second embodiment of the present invention.

Referring to FIG. 9, a second embodiment of the invention will be described below.

Specifically, one drawback of the above-described process of the first embodiment is that the top SOI surface is non-planar. In some situations, this may not be desirable. Accordingly, if a planarized surface is desired, a second embodiment of a method 900 of the present invention may be utilized as shown in FIG. 9. It is noted that the second embodiment is performed after the first embodiment has been performed.

That is, in step 901, the anneal mask is stripped (e.g., preferably by a selective etch). For example, the nitride mask may be stripped by hot phosphoric acid ($H_3PO_4$), whereas the LTO and pad oxide may be stripped with hydrofluoric acid (DHF 10:1).

Then, in step 902, the silicon is grown epitaxially. This epitaxial growth process will fill all trenches if a sufficiently thick film is grown. Such a thickness depends on the topography that must be planarized. For example, silicon epitaxy generally tends to reduce or completely washout surface steps. How thick the film deposition should be is very much dependent on the trench dimensions. It is also possible to planarize first by CMP and only later apply epitaxy to get the desired SOI thickness.

In step 903, the surface of the silicon is polished by, for example, chemical-mechanical polishing (CMP).

Finally, in step 904, the SOI is thinned to a desired thickness (e.g., depending upon the application desired) by oxidation and then the oxide is stripped.

Thus, with the second embodiment, a planarized surface is produced which is desirable for many applications.

While the invention has been described in terms of several preferred embodiments, those skilled in the art will recognize that the invention can be practiced with modification within the spirit and scope of the appended claims.

For example, while the method focuses on a patterned BOX, annealing with a mask, may be employed without patterning to obtain a thinner BOX.

Having thus described our invention, what we claim as new and desire to secure by Letters Patent is as follows:

1. A method of forming a patterned buried oxide (BOX) film, comprising in the following sequence:
    performing an implantation into a substrate;
    forming a mask on at least portions of said substrate for controlling the implantation diffusion;
    patterning the mask; and
    annealing the substrate to form a buried oxide, wherein a region that is covered by the mask has a thinner buried oxide than an area which is exposed directly to the annealing ambient.

2. The method according to claim 1, wherein said substrate comprises a Silicon wafer and said implantation comprises an oxygen implantation.

3. The method according to claim 1, wherein said mask comprises an anneal mask including a tri-layer structure of a low temperature oxide (LTO) formed on a nitride which is formed on an oxide.

4. The method according to claim 1, wherein said mask is patterned using a photo-resist lithography and reactive ion etching (RIE).

5. The method according to claim 1, wherein the substrate is annealed at an annealing temperature of about 1300° C. to about 1400° C., and the annealing is performed in an ambient of Argon with greater than about 8% oxygen, such that said annealing generates a silicon-on-insulator (SOI) layer.

6. The method according to claim 1, wherein a thicker buried oxide is formed in the open regions exposed directly to the ambient.

7. The method according to claim 1, wherein a lateral oxygen diffusion limits a minimum patterned buried oxide area obtained.

8. The method according to claim 1, wherein a patterned buried oxide thickness is tunable during a predetermined high temperature annealing.

9. The method according to claim 1, further comprising planarizing a surface of said substrate.

10. The method according to claim 9, wherein said method further comprises:
    stripping the anneal mask;
    growing a material of said substrate epitaxially to fill trenches therein;
    polishing said surface; and
    thinning the substrate to a desired thickness by oxidation and then stripping the oxide.

11. The method according to claim 1, wherein an oxygen dose controls a thickness of said buried oxide, and allows pinching off of said buried oxide in said at least portions covered by said mask.

12. The method according to claim 1, wherein if a dosage of said implantation is reduced to below a predetermined level, the buried oxide is non-continuous in said at least portions covered by said mask.

13. The method according to claim 1, further comprising:
    planarizing a surface of said substrate; and
    epitaxially growing a material of said substrate.

14. The method according to claim 1, wherein said substrate comprises a silicon-germanium (Si—Ge) substrate.

15. The method according to claim 1, wherein said substrate comprises a silicon-carbide (SiC) substrate.

16. The method of claim 1, wherein said implantation comprises a nitrogen implantation.

17. The method of claim 1, wherein said implantation comprises a n oxygen and nitrogen implantation.

18. A method of forming a patterned buried oxide film, comprising in the following sequence:
    performing an implantation into a substrate;
    forming a mask on at least portions of said substrate for controlling the implantation diffusion; and
    annealing the substrate to form a buried oxide, wherein a region that is covered by the mask has a thinner buried oxide than an area which is exposed directly to the annealing ambient.

19. The method according to claim 18, further comprising:
    patterning the mask before the annealing.

20. The method according to claim 18, wherein said mask comprises an anneal mask including a tri-layer structure of a low temperature oxide (LTO) formed on a nitride which is formed on an oxide.

21. The method according to claim 18, wherein said mask is patterned using a photo-resist lithography and reactive ion etching (RIE).

22. The method according to claim 18, wherein the substrate is annealed at an annealing temperature of about 1300° C. to about 1400° C., and the annealing is performed in an ambient of Argon with>about 8% oxygen, such that said annealing generates a silicon-on-insulator layer.

23. The method according to claim 18, wherein a thicker buried oxide is formed in the open regions.

24. The method according to claim 18, wherein a lateral implantation diffusion limits the minimum patterned buried oxide area obtained.

25. The method according to claim 18, wherein a patterned buried oxide thickness is tunable during a predetermined high temperature annealing.

26. The method according to claim 18, further comprising planarizing a surface of said substrate.

27. The method according to claim 26, wherein said method further comprises:

stripping the anneal mask;

growing a material of said substrate epitaxially to fill trenches therein;

polishing said surface; and thinning the substrate to a desired thickness by oxidation and then stripping the oxide.

28. The method according to claim 18, wherein an implantation dose controls a thickness of said buried oxide, and allows pinching off of said buried oxide in said at least portions covered by said mask.

29. The method according to claim 18, wherein if a dosage of said implantation is reduced to below a predetermined level, the buried oxide is non-continuous in said at least portions covered by said mask.

30. The method according to claim 18, further comprising:

planarizing a surface of said substrate; and epitaxially growing a material of said substrate.

31. The method of claim 18, wherein said implantation comprises an oxygen implantation.

32. The method of claim 18, wherein said substrate comprises a silicon substrate.

33. The method according to claim 18, wherein said substrate comprises a silicon-carbide (SiC) substrate.

34. The method of claim 18, wherein said implantation comprises a nitrogen implantation.

35. The method of claim 18, wherein said implantation comprises an oxygen and nitrogen implantation.

36. The method according to claim 18, wherein said substrate comprises a silicon-germanium (Si—Ge) substrate.

* * * * *